(12) United States Patent
Amiri et al.

(10) Patent No.: US 10,488,227 B2
(45) Date of Patent: Nov. 26, 2019

(54) LINEAR PHASE INTERPOLATION CIRCUIT

(71) Applicant: Kandou Labs, S.A., Lausanne (CH)

(72) Inventors: Omid Talebi Amiri, Chavannes-près-Renens (CH); Armin Tajalli, Salt Lake City, UT (US)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/274,118

(22) Filed: Feb. 12, 2019

(65) Prior Publication Data

US 2019/0178685 A1    Jun. 13, 2019

Related U.S. Application Data

(63) Continuation of application No. 15/675,412, filed on Aug. 11, 2017, now Pat. No. 10,203,226.

(51) Int. Cl.
| | |
|---|---|
| *G01D 5/24* | (2006.01) |
| *G01D 5/244* | (2006.01) |
| *G05F 3/26* | (2006.01) |
| *H03H 11/16* | (2006.01) |

(52) U.S. Cl.
CPC ......... *G01D 5/24404* (2013.01); *G05F 3/262* (2013.01); *H03H 11/16* (2013.01)

(58) Field of Classification Search
CPC ............................ G01D 5/24404; G05F 3/262
See application file for complete search history.

(56) References Cited

U.S. PATENT DOCUMENTS

| | | | |
|---|---|---|---|
| 4,839,907 A | 6/1989 | Saneski | |
| 5,266,907 A | 11/1993 | Dacus | |
| 5,528,198 A | 6/1996 | Baba et al. | |
| 5,629,651 A | 5/1997 | Mizuno | |
| 5,802,356 A | 9/1998 | Gaskins et al. | |
| 6,307,906 B1 | 10/2001 | Tanji et al. | |
| 6,316,987 B1 | 11/2001 | Dally et al. | |
| 6,380,783 B1* | 4/2002 | Chao ........................ | H03K 5/08 327/239 |
| 6,389,091 B1 | 5/2002 | Yamaguchi et al. | |

(Continued)

FOREIGN PATENT DOCUMENTS

CN          203675093 U       6/2014

OTHER PUBLICATIONS

Loh, Mattew, et al., "A 3×9 Gb/s Shared, All-Digital CDR for High-Speed, High-Density I/O", IEEE Journal of Solid-State Circuits, vol. 47, No. 3, Mar. 2012, 641-651 (11 pages).

*Primary Examiner* — Kabir A Timory
(74) *Attorney, Agent, or Firm* — Invention Mine LLC

(57) ABSTRACT

Methods and systems are described for receiving a control step input at a binary-to-thermometer decoder and responsively generating bits of a thermometer codeword representative of the control step input, providing the bits of the thermometer codeword to a plurality of differential pairs comprising a first transistor and a second transistor, each differential pair configurable for one of directing current to an in-phase (I) common node or directing current to a quadrature phase (Q) common node and switching between directing current to the I common node and the Q common node, and forming an output signal based on current drawn through the I and Q common nodes, the output signal having an intermediate phase with respect to a first and a second reference signal.

20 Claims, 19 Drawing Sheets

(56) References Cited

U.S. PATENT DOCUMENTS

| | | | |
|---|---|---|---|
| 6,509,773 B2 | 1/2003 | Buchwald et al. | |
| 6,717,478 B1 | 4/2004 | Kim et al. | |
| 7,199,728 B2 | 4/2007 | Dally et al. | |
| 7,336,112 B1 | 2/2008 | Sha et al. | |
| 7,535,957 B2 | 5/2009 | Ozawa et al. | |
| 7,616,075 B2 | 11/2009 | Kushiyama | |
| 7,650,525 B1 | 1/2010 | Chang et al. | |
| 7,688,929 B2 | 3/2010 | Co | |
| 7,860,190 B2 | 12/2010 | Feller | |
| 8,036,300 B2 | 10/2011 | Evans et al. | |
| 8,253,454 B2 | 8/2012 | Lin | |
| 8,791,735 B1 | 7/2014 | Shibasaki | |
| 9,036,764 B1 | 5/2015 | Hossain et al. | |
| 9,059,816 B1 | 6/2015 | Simpson et al. | |
| 9,306,621 B2 | 4/2016 | Zhang et al. | |
| 9,374,250 B1 | 6/2016 | Musah et al. | |
| 9,397,868 B1 | 7/2016 | Hossain et al. | |
| 9,520,883 B2 | 12/2016 | Shibasaki | |
| 9,565,036 B2 | 2/2017 | Zerbe et al. | |
| 9,577,815 B1 | 2/2017 | Simpson et al. | |
| 9,906,358 B1 | 2/2018 | Tajalli | |
| 10,055,372 B2 | 8/2018 | Shokrollahi | |
| 2003/0001557 A1 | 1/2003 | Pisipaty | |
| 2003/0146783 A1 | 8/2003 | Bandy et al. | |
| 2004/0092240 A1 | 5/2004 | Hayashi | |
| 2005/0024117 A1 | 2/2005 | Kubo et al. | |
| 2005/0117404 A1 | 6/2005 | Savoj | |
| 2005/0128018 A1 | 6/2005 | Meltzer | |
| 2005/0220182 A1 | 10/2005 | Kuwata | |
| 2005/0275470 A1 | 12/2005 | Choi | |
| 2006/0140324 A1 | 6/2006 | Casper et al. | |
| 2006/0232461 A1* | 10/2006 | Felder | H03M 1/462 341/161 |
| 2006/0291589 A1* | 12/2006 | Eliezer | H03C 3/40 375/302 |
| 2007/0001713 A1 | 1/2007 | Lin | |
| 2007/0001723 A1 | 1/2007 | Lin | |
| 2007/0047689 A1 | 3/2007 | Menolfi et al. | |
| 2007/0147559 A1 | 6/2007 | Lapointe | |
| 2007/0201597 A1* | 8/2007 | He | H03D 13/005 375/376 |
| 2008/0007367 A1 | 1/2008 | Kim | |
| 2008/0317188 A1 | 12/2008 | Staszewski et al. | |
| 2009/0167389 A1 | 7/2009 | Reis | |
| 2009/0195281 A1 | 8/2009 | Tamura et al. | |
| 2009/0262876 A1 | 10/2009 | Arima et al. | |
| 2010/0180143 A1 | 7/2010 | Ware et al. | |
| 2010/0220828 A1 | 9/2010 | Fuller et al. | |
| 2011/0311008 A1 | 12/2011 | Slezak et al. | |
| 2012/0327993 A1 | 12/2012 | Palmer | |
| 2013/0088274 A1 | 4/2013 | Gu | |
| 2013/0091392 A1 | 4/2013 | Valliappan et al. | |
| 2013/0207706 A1 | 8/2013 | Yanagisawa | |
| 2013/0271194 A1 | 10/2013 | Madoglio et al. | |
| 2013/0285720 A1 | 10/2013 | Jibry | |
| 2013/0314142 A1 | 11/2013 | Tamura et al. | |
| 2014/0286381 A1 | 9/2014 | Shibasaki | |
| 2015/0078495 A1 | 3/2015 | Hossain et al. | |
| 2015/0117579 A1 | 4/2015 | Shibasaki | |
| 2015/0180642 A1 | 6/2015 | Hsieh et al. | |
| 2015/0220472 A1 | 8/2015 | Sengoku | |
| 2015/0256326 A1 | 9/2015 | Simpson et al. | |
| 2016/0056980 A1 | 2/2016 | Wang et al. | |
| 2017/0310456 A1 | 10/2017 | Tajalli | |

\* cited by examiner

7-Bit Phase Interpolator

5-Bit DAC

LINEAR PHASE INTERPOLATION CIRCUIT

CROSS-REFERENCE TO RELATED APPLICATIONS

This application is a continuation of U.S. application Ser. No. 15/675,412, filed Aug. 11, 2017, entitled "Phase Interpolation Circuit", naming Omid Talebi Amiri, which is hereby incorporated by reference in its entirety for all purposes.

REFERENCES

The following prior applications are herein incorporated by reference in their entirety for all purposes:

U.S. patent application Ser. No. 14/925,686, filed Oct. 28, 2015, naming Armin Tajalli, entitled "Enhanced Phase Interpolation Circuit", hereinafter identified as [Tajalli I].

The following additional references to prior art have been cited in this application:

U.S. Pat. No. 9,208,130, filed Aug. 16, 2012 and issued Dec. 8, 2015, naming Ming-Shuan Chen, entitled "Phase Interpolator", hereinafter identified as [Chen].

BACKGROUND

Clocked digital communications systems often require timing signals which are offset in phase or delay from a known reference clock signal, either to provide an appropriate set-up or hold interval, or to compensate for propagation delay between the point of use and the location of the reference clock source. Systems relying on a single reference clock often utilize fixed or adjustable delay lines or delay circuits to generate a secondary clock signal which is time-offset from the original reference. As another example, a serial communications receiver may have a local clock synthesized from received data transitions, which may be phase-shifted an appropriate amount to allow its use in sampling the received data stream. Alternatively, systems providing a multi-phase reference clock, one example being a two-phase quadrature clock, may utilize phase interpolation techniques to generate a secondary clock signal intermediate to the two reference clock phases; in other words, having a phase offset interpolated between those of the reference clock phases.

Such phase interpolators also found extensive use in RF communications applications, as one example in producing an output signal having a particular phase relationship used to drive one element of a multi-element antenna array, such that the collection of element arrays driven by such output signals resulted in an output beam with the desired directional characteristics.

In one such application, two sinusoidal reference input signals having relative phase relationships of 90 degrees (thus commonly referred to as sine and cosine signals) are presented as inputs to the phase interpolator having an output W of:

$$W=A*\sin(\omega t)+(1-A)*\cos(\omega t) \quad \text{(Eqn. 1)}$$

where the control input A is varied between (in this example) 0 and 1 to set the relative phase of output W as compared to reference inputs $\sin(\omega t)$ and $\cos(\omega t)$ Following common practice in the art, this document will utilize this well-known phase interpolator nomenclature, without implying any limitation to two clocks having that particular phase relationship, sinusoidal signals, single-quadrant versus multiple-quadrant operation, or a particular domain of applicability.

DETAILED DESCRIPTION

Figure 1:
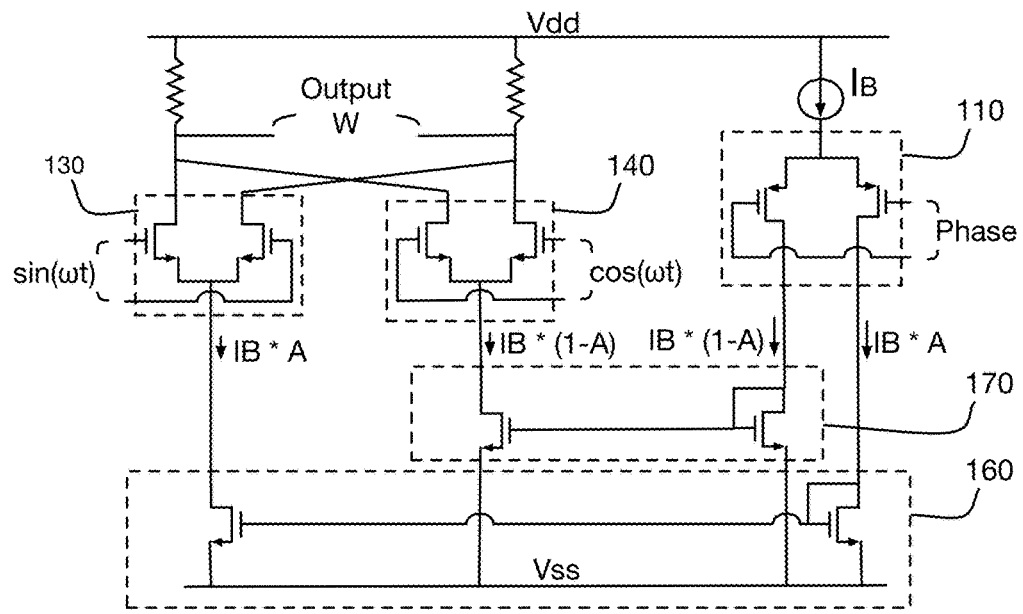
FIG. 1 illustrates one example of a prior art phase interpolation circuit.

FIG. 1 illustrates one example of a prior art phase interpolator circuit suitable for embodiment in, as one example, an integrated circuit. It accepts sinusoidal reference clock inputs having a fixed quadrature phase relationship, identified as $\sin(\omega t)$ and $\cos(\omega t)$, as well as differential control signal inputs A and Á which select the relative phase of an output signal produced at differential output W, as described by Eqn. 1.

As will be well understood by one familiar with the art, the circuit of FIG. 1 utilizes differential transistor pair 110 to partition a fixed source current $I_B$ into two fractional currents $I_B*A$ and $I_B*(1-A)$ as directed by inputs A and Á, those fractional currents thus corresponding to the A and (1−A) factors of Eqn. 1. Fractional current $I_B*A$ is mirrored by current mirror 160 to provide a current sink for differential pair 130, and fractional current $I_B*(1-A)$ is mirrored by current mirror 170 to provide a current sink for differential pair 140. Reference clock signals $\sin(\omega t)$ are input to 130, thus the current flow through 130 is a linear function of both $I_A$ and $\sin(\omega t)$. Similarly, reference clock signals $\cos(\omega t)$ are input to 140, thus the current flow through 140 is a linear function of both $I_B*(1-A)$ and $\cos(\omega t)$. As differential transistor pairs 130 and 140 are connected in parallel to load resistors $R_{L1}$ and $R_{L2}$ across which differential output W is produced, output W is derived from the sum of the current flows through 130 and 140, thus representing a physical embodiment of the relationship described by Eqn. 1 above.

In one typical embodiment, output W includes a sinusoidal or approximately sinusoidal linear waveform having a phase relationship intermediate between those of the sin(ωt) and cos(ωt) reference clock inputs, as controlled by A in the region 0≤A≤1. In a further embodiment, outputs W and Ẇ are digital waveforms comprised of edge transitions having the described phase relationship, the digital output conversion occurring through the introduction of such known functional element as a zero-crossing detector, digital comparator, or analog limiter, to convert the sinusoidal result of Eqn. 1 into a digital waveform.

A known limitation of this type of phase interpolation is the non-linear nature of the control relationship between the phase control signal value and the resultant phase offset of the output signal. As will be readily apparent to one familiar with the art, Eqn. 1 implies that the phase of result W varies as arctan $$\left(\frac{A}{1-A}\right)$$

which is linear near the center of its range (e.g. around A=0.5) but becomes significantly nonlinear as A moves towards its extremes. Thus, a system reliant on a phase interpolator of this type where the phase of W is approximately 45 degrees offset from both the sine and cosine reference clocks would experience relatively smooth and consistent incremental variation of such phase for small incremental adjustments of A. However, as A is adjusted further, the amount of phase change per incremental change of A will begin to deviate from that consistent behavior by a nonlinearly varying amount.

Waveform Effects

For clarity of explanation and consistency with past practice, the previous examples of phase interpolation have assumed orthogonal reference clocks that are pure sinusoids. However, other waveforms and input phase relationships are equally applicable, and indeed other waveforms may be more easily produced within a digital integrated circuit environment than pure sinusoids. As one example, pseudo-sinusoidal waveforms, i.e. those having predominantly sinusoidal characteristics but presenting some amount of residual waveform distortion or additional spectral content, often may be utilized in comparable manner to pure sinusoids.

As one example, logic elements including ring oscillators and buffers operating at or near the frequency limits for a particular integrated circuit process may be observed to produce nearly sinusoidal outputs. This phenomenon may be explained by observing that the Fourier spectrum of a square wave has significant energy only at its fundamental frequency, third harmonic frequency, and subsequent odd harmonic frequencies. Thus, at operating frequencies where the fundamental signal frequency is near the transistor cutoff frequency, that signal's third, fifth, etc. harmonics (necessary to form a conventional square wave digital waveform) will be significantly attenuated, leaving a primarily sinusoidal result.

The relative control signal linearity of a phase interpolator will be dependent on both the actual signal waveforms and on the mixing algorithm used. Perfect triangle wave (e.g. constant slew rate) quadrature reference inputs, for example, are capable of producing completely linear control signal behavior with linear arithmetic summation. [Tajalli I] suggests that reference inputs having rounded (e.g. partial high frequency attenuation) or logarithmic (e.g. RC time constant constrained) rise times may show more linear control signal behavior with square root summation.

Polar Representation of Interpolator

Figure 2:
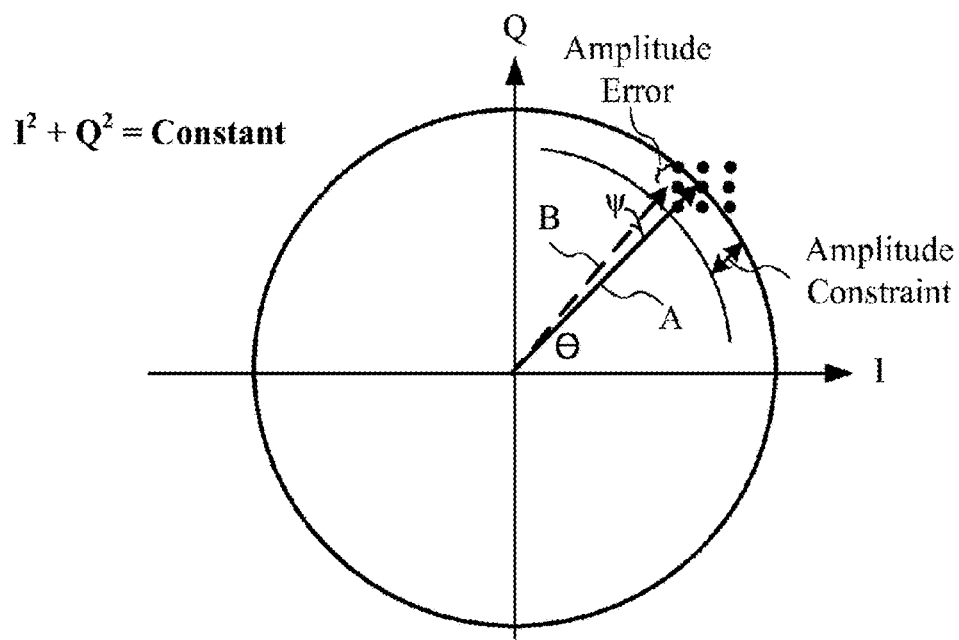
FIG. 2 is a polar representation of signal vector A rotated to a destination B described by orthogonal coordinates I and Q.

FIG. 2 shows the behavior of a phase interpolator as a polar coordinate rotation of a vector A to a destination B defined by orthogonal values I and Q. [Chen] teaches I and Q control signals in the relationship $$I^2+Q^2=\text{constant} \qquad \text{(Eqn. 2)}$$

as part of a described process of clock vector rotation. Some embodiments utilize polar vector rotation to perform clock phase interpolation, but with significantly less circuit complexity and power consumption than such prior art methods. The shaping function of Eqns. 3 and 4 are used on the control signals to minimize error of the rotated vector $$Q==>[0:1:2^n-1], I=\text{round}(\sqrt{(R^2-Q^2)}) \qquad \text{(Eqn. 3)}$$

$$R=\sqrt{2}*0.5*(2^n-1) \qquad \text{(Eqn. 4)}$$

Figure 11:
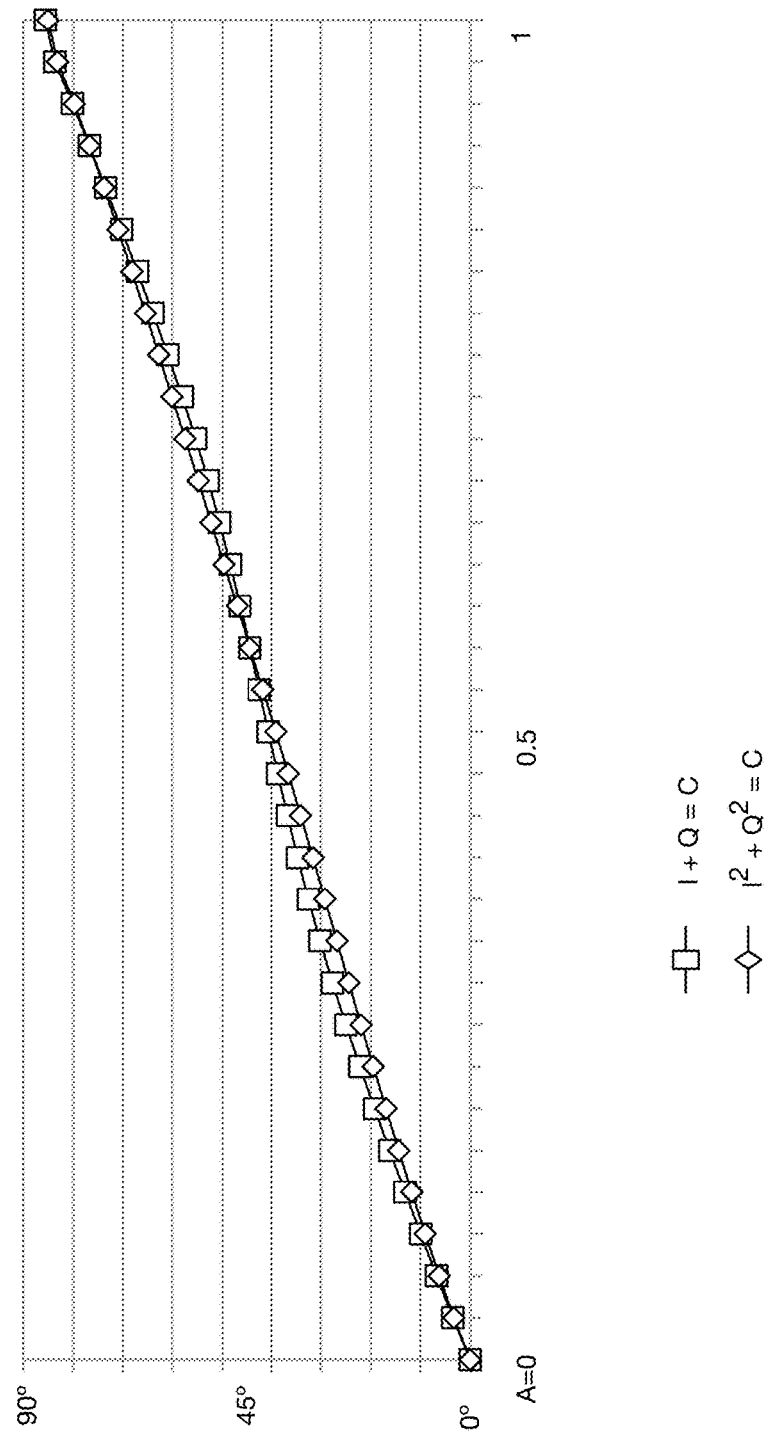
FIG. 11 is a graph illustrating phase linearity in accordance with some embodiments.

The resulting values I and Q may be used directly as the Phase inputs for sin(ωt) and cosine(ωt) clocks in a phase interpolator such as shown in FIG. 1. In an alternative embodiment, the I and Q signals presented as currents may directly replace the FIG. 1 currents $I_B*A$ and $I_B*(1-A)$ respectively. FIG. 11 illustrates curves showing the linearity of the phase relationships for I+Q=C and $I^2+Q^2=C$. As shown, the $I^2+Q^2=C$ relationship has a more linear phase relationship than that of I+Q=C.

Generation of the I and Q signals controlling the clock mixing stages is complicated by the need to not only provide the necessary mapping of values to minimize the resulting vector amplitude and phase errors, but also to do so while minimizing power consumption in the overall circuit. Thus, as one example, generating I and Q values using R-2R resistive ladder DACs might provide sufficient resolution but would draw significant quiescent current. As another example, DACs based on a $2^N$ resistor chain would provide excellent monotonicity and could incorporate the necessary curve matching, but again would draw significant quiescent current.

Figure 3:
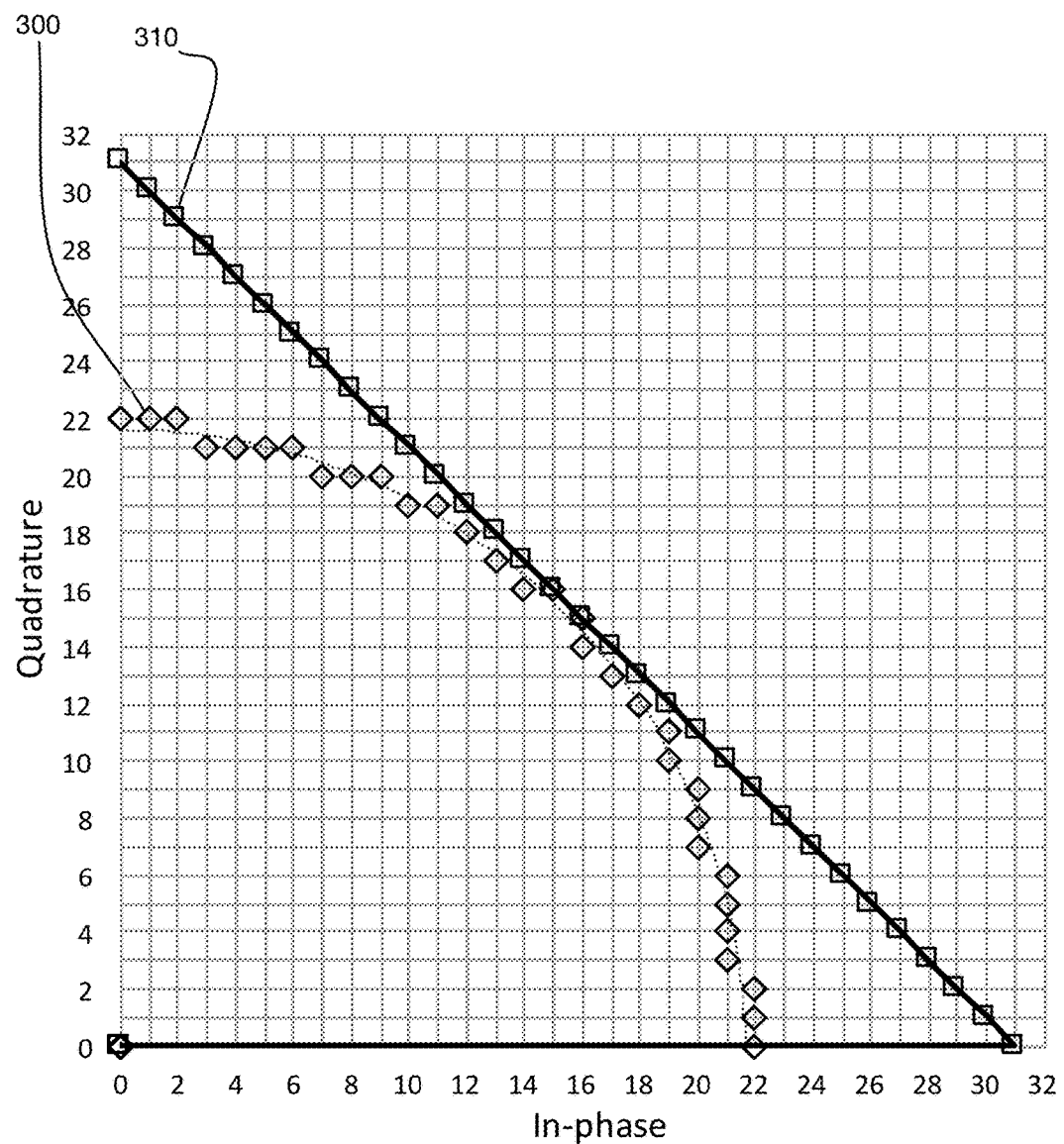
FIG. 3 is a graph showing one embodiment of the fitted curve 300 derived from linear input 310.

As shown in FIG. 3, the I and Q curves 300 defined by Eqns. 3 and 4 are always lower than a straight-line linear increase 310; that is, the necessary curve shaping function only needs to decrease from an input linear value, never to augment it. One efficient embodiment utilizes an encoding of the I and Q control values represented in unary (also known as a "counting" or "thermometer") code. For example, to provide 32 discrete control steps, each code is represented as a set of 0 to 31 enabled digital values (as an example, a grouping of 31 wires carrying that set of digital "1"s). Each enabled element of the set activates a control gate providing a current output, with the sum of all control gate outputs being the analog result of the function. One embodiment incorporates an array of 31 identical NMOS gates to implement each of I and Q, each gate designed to source a fixed amount of current when enabled (the fixed current defined by constraint of the transistor dimensions in one particular embodiment, and by an explicit current source in another particular embodiment). The curve fitting to satisfy Eqn. 3 is obtained by selectively connecting only a chosen subset of the gate outputs to the common summation node.

Figure 4:
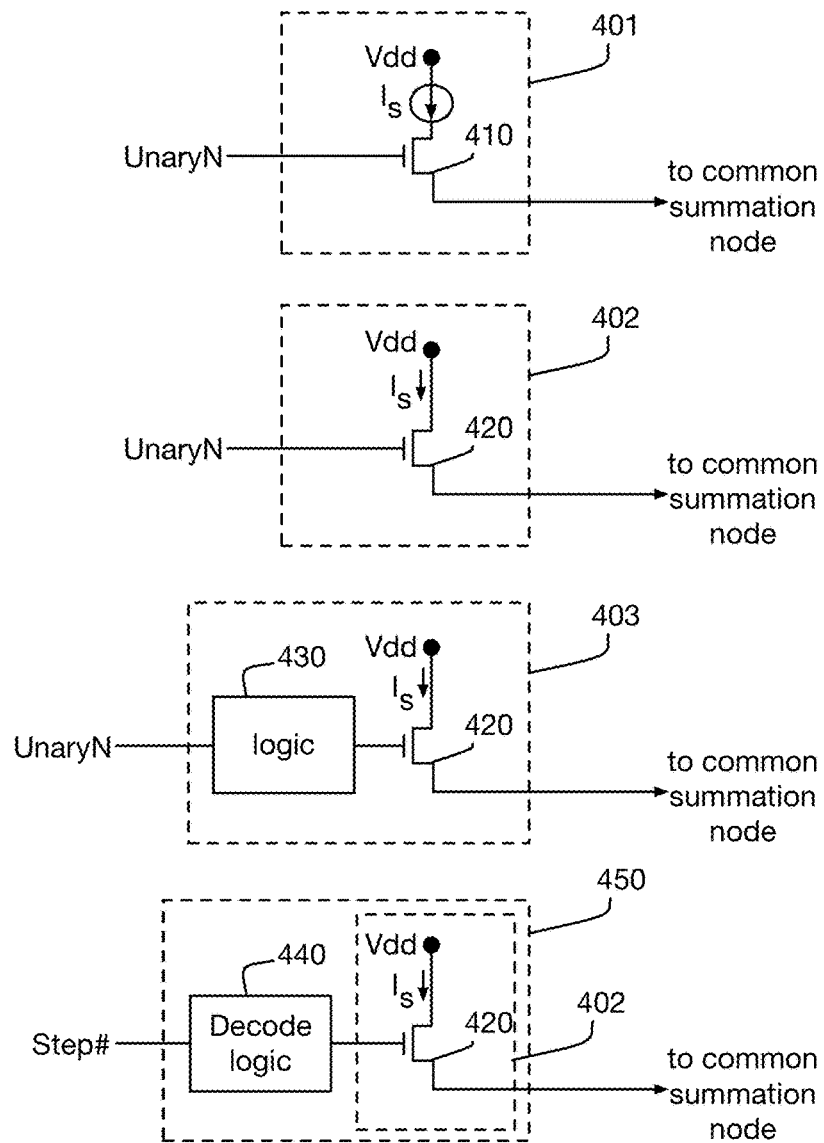
FIG. 4 illustrates schematics for NMOS gates, in accordance with some embodiments.

FIG. 4 illustrates several embodiments of the NMOS gate. Gate 401 utilizes a fixed current source to set output current $I_s$ which is then selectively passed by transistor 410 to the output under control of input UnaryN. Gate 402 is similar, but constrains output current $I_s$ by controlling the dimensions of transistor 420. Gate 403 optionally includes digital logic 430 such as a Boolean AND, OR, or other function in the input control signal path. In the further embodiment of Gate 450, digital logic 440 locally converts an input step# into an internal control signal used to control gate 402, in applications where such distributed logic is preferable to a centralized unary conversion and its multiple wire outputs. As all of the embodiments are functionally equivalent, the designation "400" is used in subsequent figures to identify the generic NMOS gate function performed.

TABLE I

| Step | Q | I |
|---|---|---|
| 0 | 0 | 22 |
| 1 | 1 | 22 |
| 2 | 2 | 22 |
| 3 | 3 | 21 |
| 4 | 4 | 21 |
| 5 | 5 | 21 |
| 6 | 6 | 21 |
| 7 | 7 | 20 |
| 8 | 8 | 20 |
| 9 | 9 | 20 |
| 10 | 10 | 19 |
| 11 | 11 | 19 |
| 12 | 12 | 18 |
| 13 | 13 | 17 |
| 14 | 14 | 16 |
| 15 | 15 | 16 |
| 16 | 16 | 15 |
| 17 | 16 | 14 |
| 18 | 17 | 13 |
| 19 | 18 | 12 |
| 20 | 19 | 11 |
| 21 | 19 | 10 |
| 22 | 20 | 9 |
| 23 | 20 | 8 |
| 24 | 20 | 7 |
| 25 | 21 | 6 |
| 26 | 21 | 5 |
| 27 | 21 | 4 |
| 28 | 21 | 3 |
| 29 | 22 | 2 |
| 30 | 22 | 1 |
| 31 | 22 | 0 |

Table I illustrates one embodiment of the curve-fitting function of Eqn. 3, where control steps 0-31 represent the 32 possible phase interpolation angles this embodiment provides. As may be seen, for control steps 0-16 the value of Q increases linearly; in the schematic of FIG. 5 this is represented as each of the NMOS gates 400 enabled by the unary encoding 510 of control step values 1-16 are connected to the common summing node for the Q control value, and as each such gate is consecutively enabled the current to the Q summing node increases incrementally. However, there is no comparable incremental increase for control step 17; in FIG. 5 this is embodied as the corresponding NMOS gate enabled by control step value 17 intentionally being unconnected to the common summing node for Q. Similarly, the remainder of gates 400 are connected to the common summing node for Q, except for the gates enabled by control step values 17 (as previously described), 21, 23, 24, 26, 27, 28, 30, and 31 which are not connected.

Figure 6:
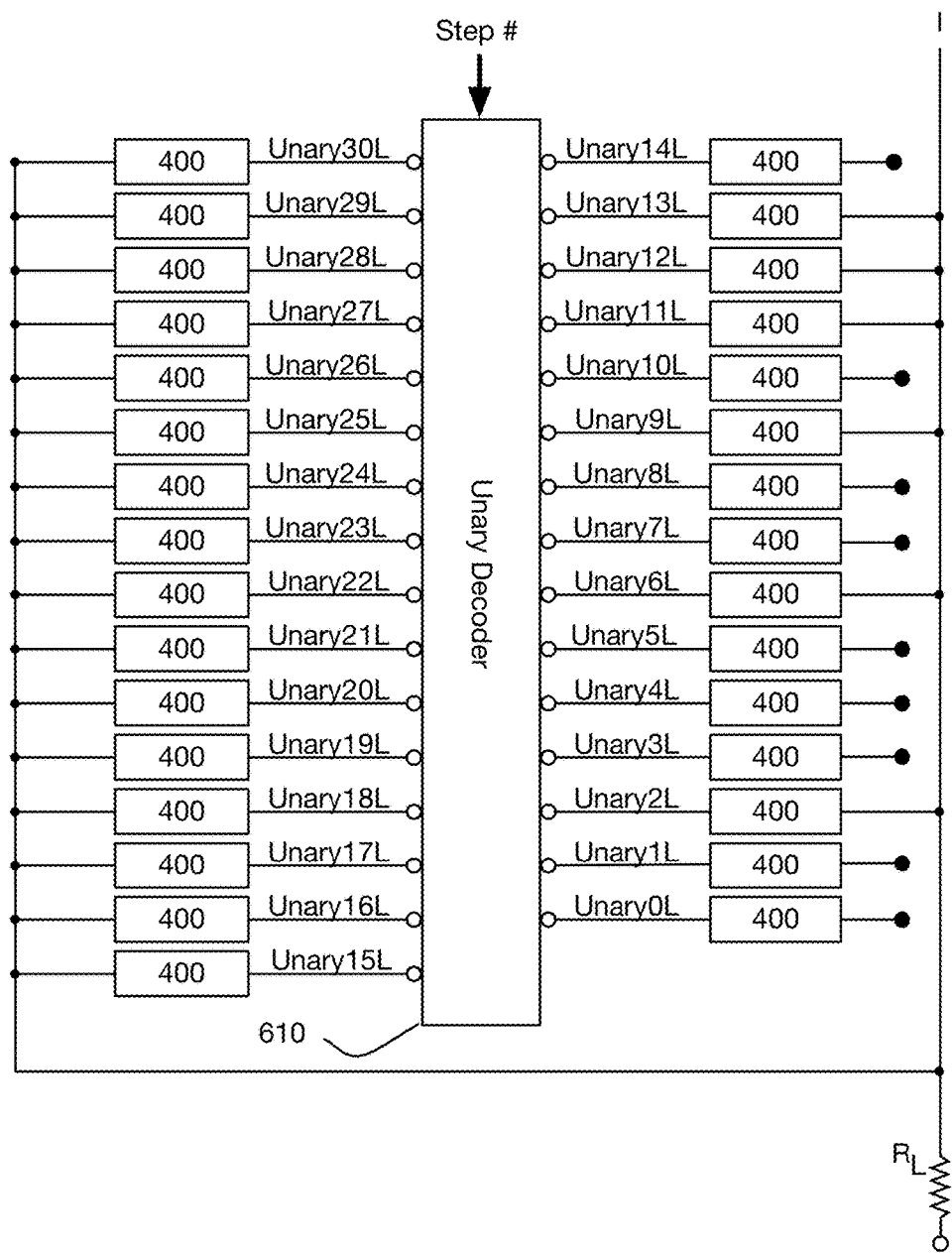
FIG. 6 is a schematic for producing an in-phase (I) control signal, in accordance with some embodiments.

FIG. 6 shows the equivalent schematic producing the I control signal. One familiar with digital logic will observe that a combination of the inverse sign of signals Unary0-Unary30 as well as connecting the signals in a reversed order produces the desired control effect for I, starting at a maximum for step#0 and slowly decreasing until step 12 in which there is subsequently an incremental decrease as step# increases. This is shown in FIG. 6 by the indication that unary decoder 610 outputs active-low signals Unary0L-Unary30L. In a practical embodiment, a single physical decoder (subsuming the illustrated 510 and 610 functions) may output both active high and active low signals to control both I and Q outputs. In some embodiments, the first set of control bits representing the Q signal and the second set of control bits representing the I signal have inverted signs and reversed order. In an alternative embodiment, two instances of an identical decoder may be used for 510 and 610, with the latter receiving step # signals that are logically inverted, thus producing the desired counting-down behavior for I.

Figure 7:
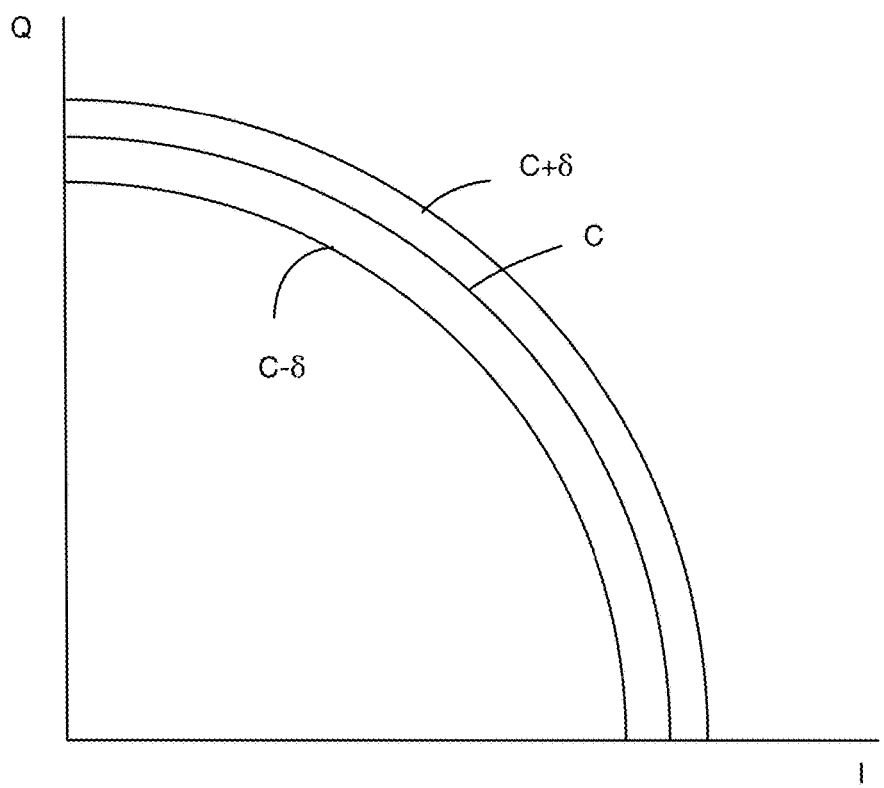
FIG. 7 illustrates a tolerance region, in accordance with some embodiments.

As shown in FIG. 3, the curve 310 approximately follows the unit circle shown in FIG. 2, however $I^2+Q^2$ does not equal a constant value. In some embodiments, a sum of squares of the first and second control signals $I^2$ and $Q^2$ respectively sum to within a predetermined threshold δ of a constant value C. FIG. 7 illustrates this concept. As shown in FIG. 7, a constant value C is chosen, which represents a sum of squares of the I and Q components. As long as a sum of squares of the I and Q components for each discrete step is within ±δ of C, there will be a linear change in phase with each step. That is to say:

$$|C-(I^2+Q^2)| \le \delta \quad \text{Eqn. 5}$$

In order to achieve the above constraint, additional incremental steps may be added to provide a higher resolution between steps. For example, in some embodiments, 64 or 128 steps may be used, however it should be noted that any number of steps is acceptable as long as Eqn. 5 is satisfied.

Figure 5:
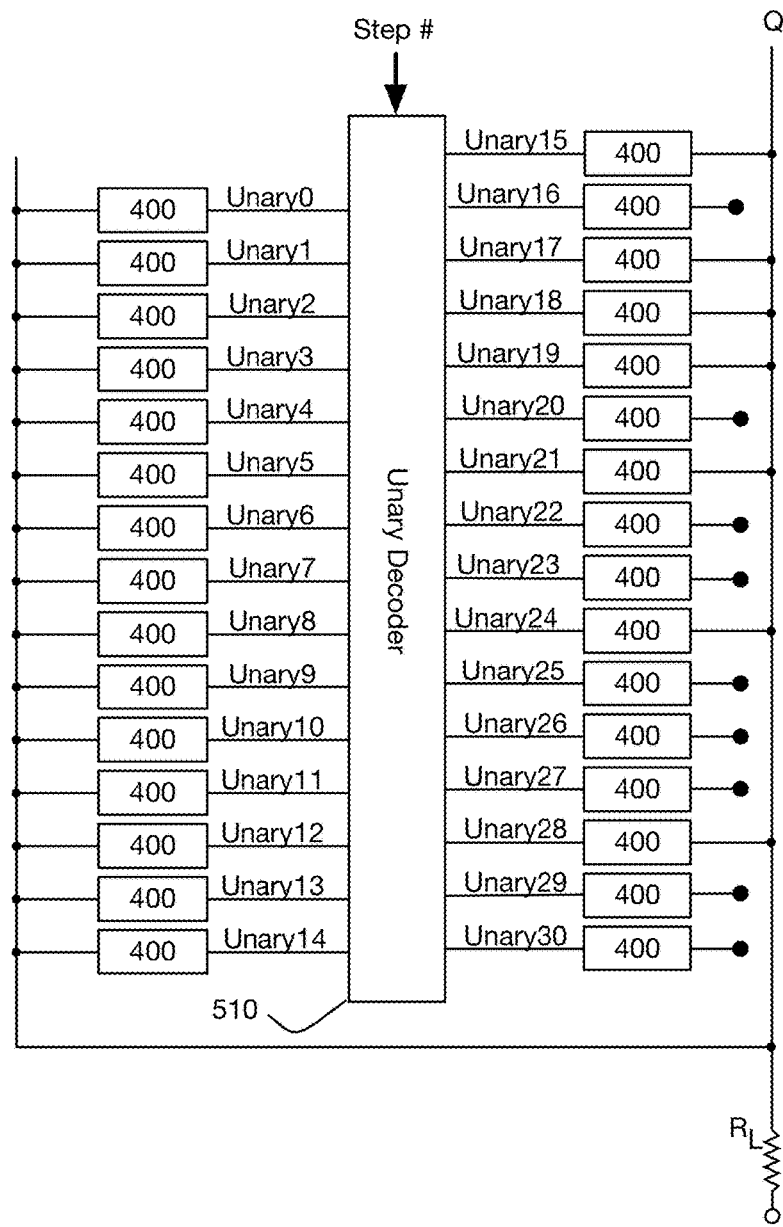
FIG. 5 is a schematic for producing a quadrature (Q) control signal, in accordance with some embodiments.

In one embodiment, the transistor drain providing the output for each NMOS gate 400 not connected to a summing node is connected to Vdd as shown in FIGS. 5 and 6; in an alternate embodiment, those transistor drains are open circuits; in a further embodiment, the output transistor for the unconnected gates is deleted. These variations provide equivalent function output behavior, while offering different trade-offs regarding circuit node loading and parasitic capacitance variation.

No limitation is implied in the descriptive example of 32 interpolation steps; other embodiments may provide different numbers of steps with higher or lower step granularity. Similarly, equivalent embodiments may be produced using PMOS gates and/or removal of incremental amounts of current from a common summation node rather than the example NMOS gates sourcing incremental amounts of current to a common summation node. Equivalent embodiments may also incorporate CMOS gates capable of both sinking and sourcing current to a common node. Similarly, functionally equivalent embodiments may utilize sets of gates driving summation nodes, wherein each gate is controlled by the decoding of a control value in another encoded form, for example as a binary code.

Figure 8:
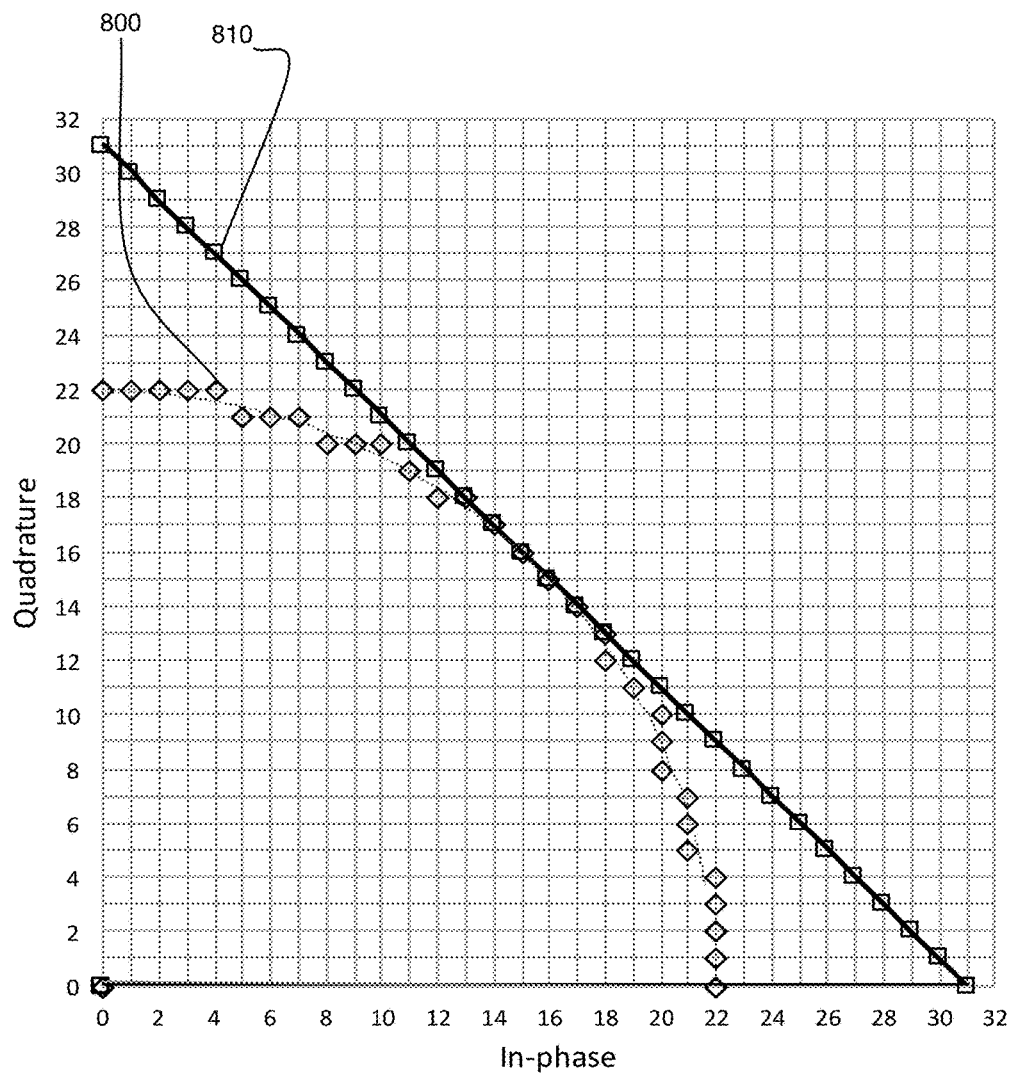
FIG. 8 is a graph of a fitted curve derived from a linear input.

FIG. 8 illustrates an approximation curve similar to the curve of FIG. 3. The curve shown in FIG. 8 represents the following table:

TABLE II

| Step | Q | I |
|---|---|---|
| 0 | 0 | 22 |

TABLE II-continued

| Step | Q | I |
|---|---|---|
| 1 | 1 | 22 |
| 2 | 2 | 22 |
| 3 | 3 | 22 |
| 4 | 4 | 22 |
| 5 | 5 | 21 |
| 6 | 6 | 21 |
| 7 | 7 | 21 |
| 8 | 8 | 20 |
| 9 | 9 | 20 |
| 10 | 10 | 20 |
| 11 | 11 | 19 |
| 12 | 12 | 18 |
| 13 | 13 | 18 |
| 14 | 14 | 17 |
| 15 | 15 | 16 |
| 16 | 16 | 15 |
| 17 | 17 | 14 |
| 18 | 18 | 13 |
| 19 | 18 | 12 |
| 20 | 19 | 11 |
| 21 | 20 | 10 |
| 22 | 20 | 9 |
| 23 | 20 | 8 |
| 24 | 21 | 7 |
| 25 | 21 | 6 |
| 26 | 21 | 5 |
| 27 | 22 | 4 |
| 28 | 22 | 3 |
| 29 | 22 | 2 |
| 30 | 22 | 1 |
| 31 | 22 | 0 |

Figure 9:
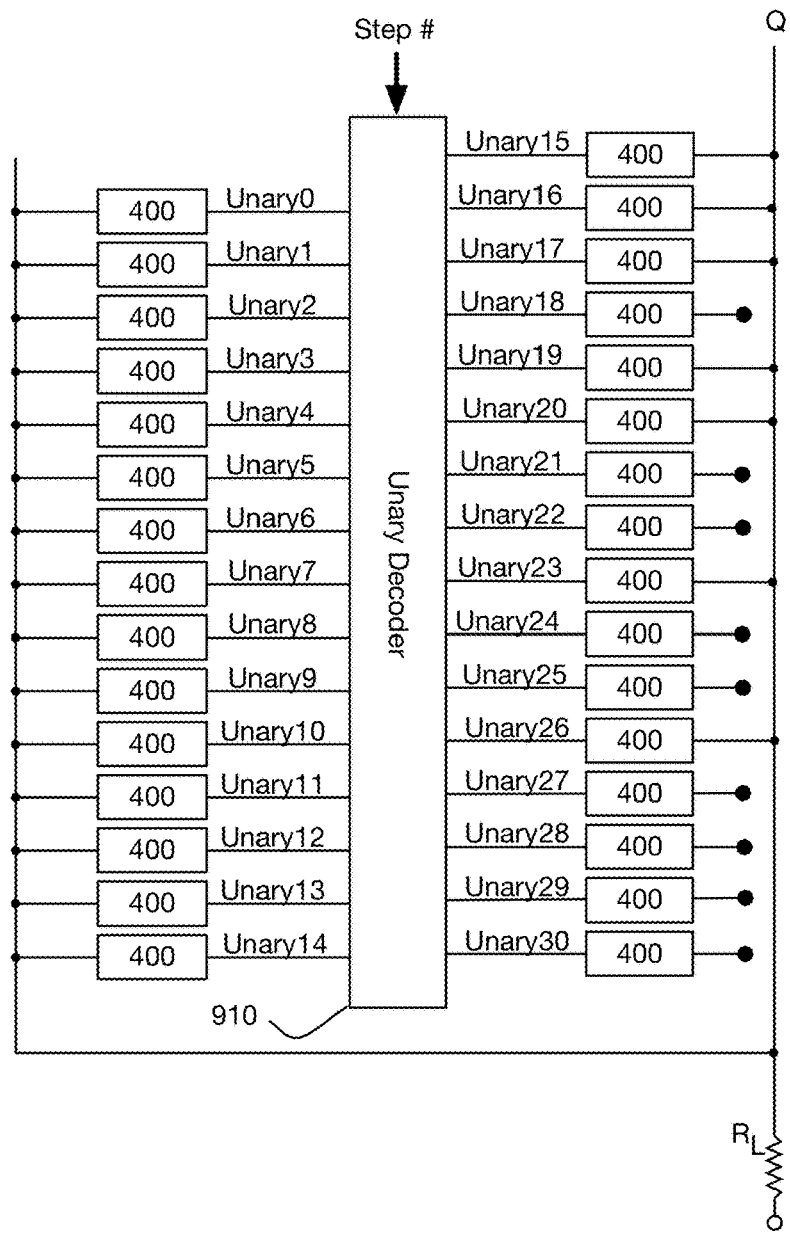
FIG. 9 is a schematic for producing a Q control signal, in accordance with some embodiments.
Figure 10:
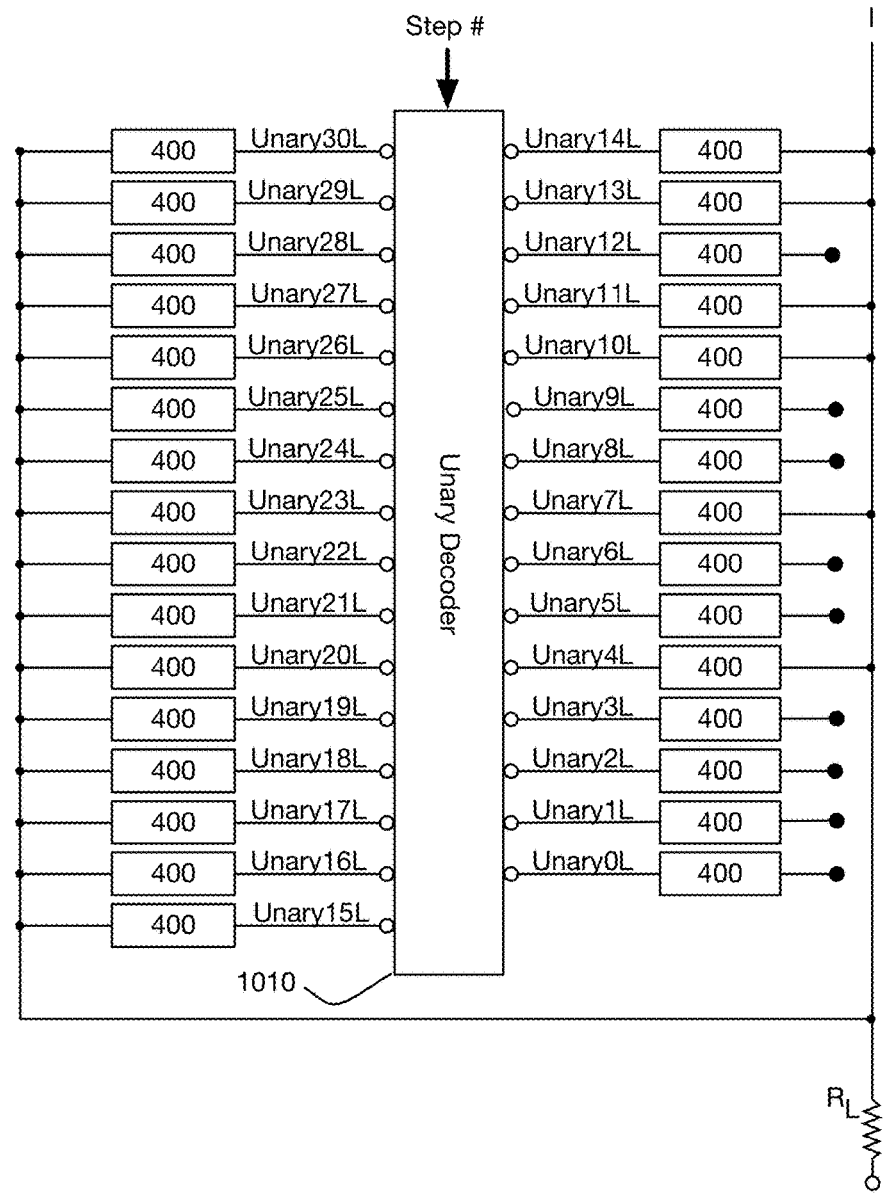
FIG. 10 is a schematic for producing an I control signal, in accordance with some embodiments.

The corresponding schematics for the generation of the Q and I signals are given in FIGS. 9 and 10, respectively.

Figure 12:
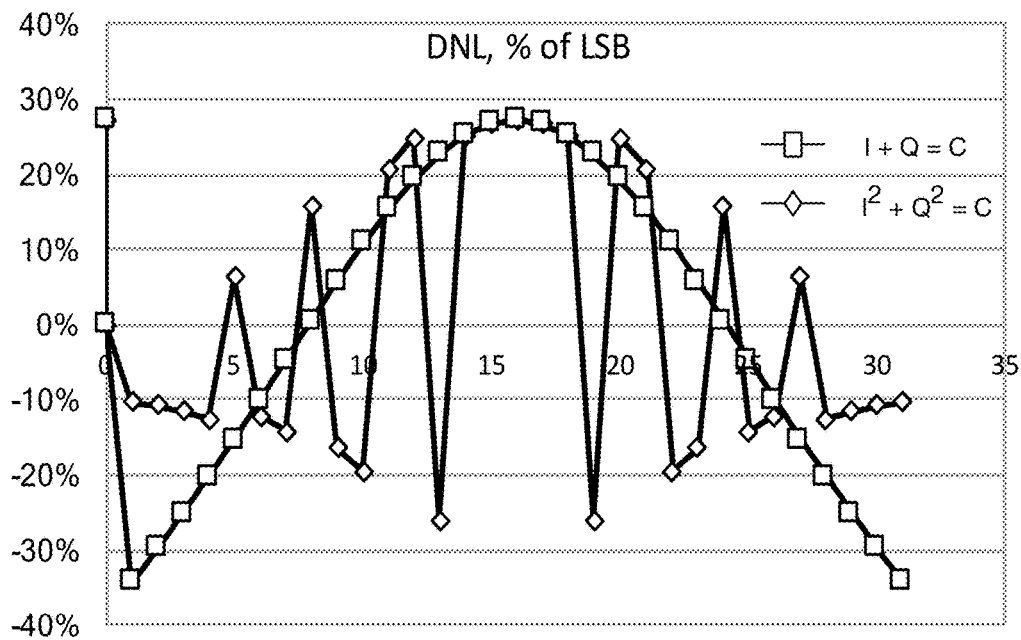
FIG. 12 is a graph illustrating differential non-linearity (DNL), in accordance with some embodiments.
Figure 13:
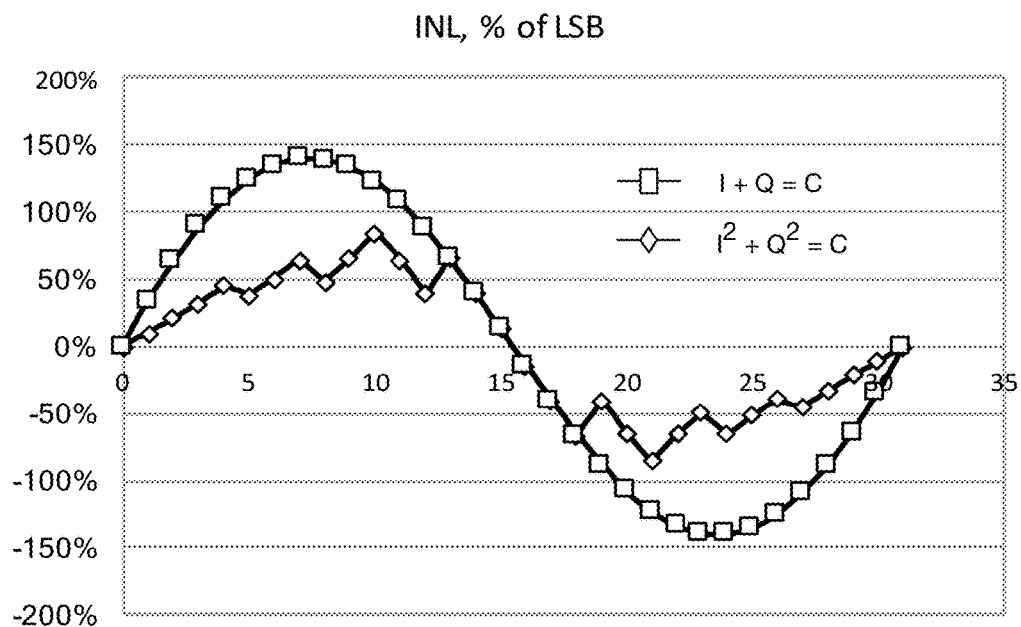
FIG. 13 is a graph illustrating integral non-linearity (INL), in accordance with some embodiments.
Figure 14:
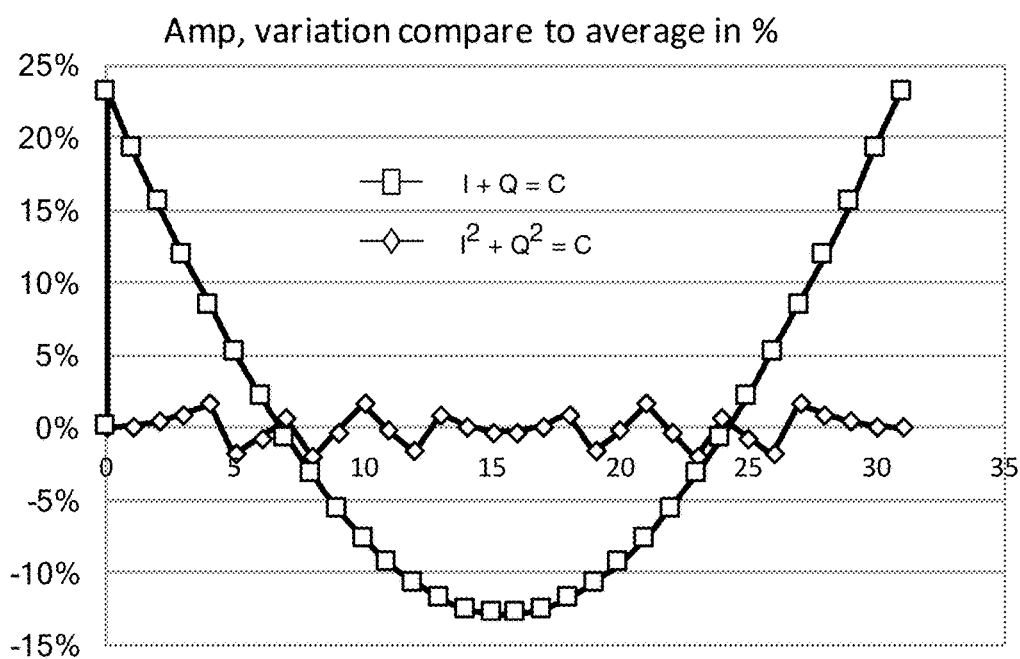
FIG. 14 is a graph illustrating amplitude variation, in accordance with some embodiments.

FIGS. 12-14 are plots comparing performance of a conventional PI to PIs in accordance with embodiments described above. In each plot, the PIs receive two reference clocks having 90 degree phase differences. FIG. 12 is a graph illustrating differential non-linearity (DNL). As shown, the maximum value of DNL is approximately the same, however the proposed PI demonstrates smaller mean absolute deviation of DNL as compared to the conventional PI.

FIG. 13 is a graph illustrating integral non-linearity (INL) for a PI in accordance with embodiments described above against the conventional PI. FIG. 13 illustrates that INL improves from ±1.4LSB to ±0.85LSB. In both PIs, increasing the number of bits does not have a significant effect on the INL.

FIG. 14 is a graph illustrating amplitude variation at the output of PIs versus the PI code. Amplitude variation is converted to phase error in the next stages. Amplitude to Phase conversion is one of the main sources of phase error, causing PI nonlinearity. As shown, proposed embodiments demonstrate significant improvement in amplitude variation compare to conventional PIs. Further, amplitude variation may be improved by increasing number of bits in the proposed PI, unlike in Conventional PI which amplitude variation is rather independent of number of bits.

Figure 15:
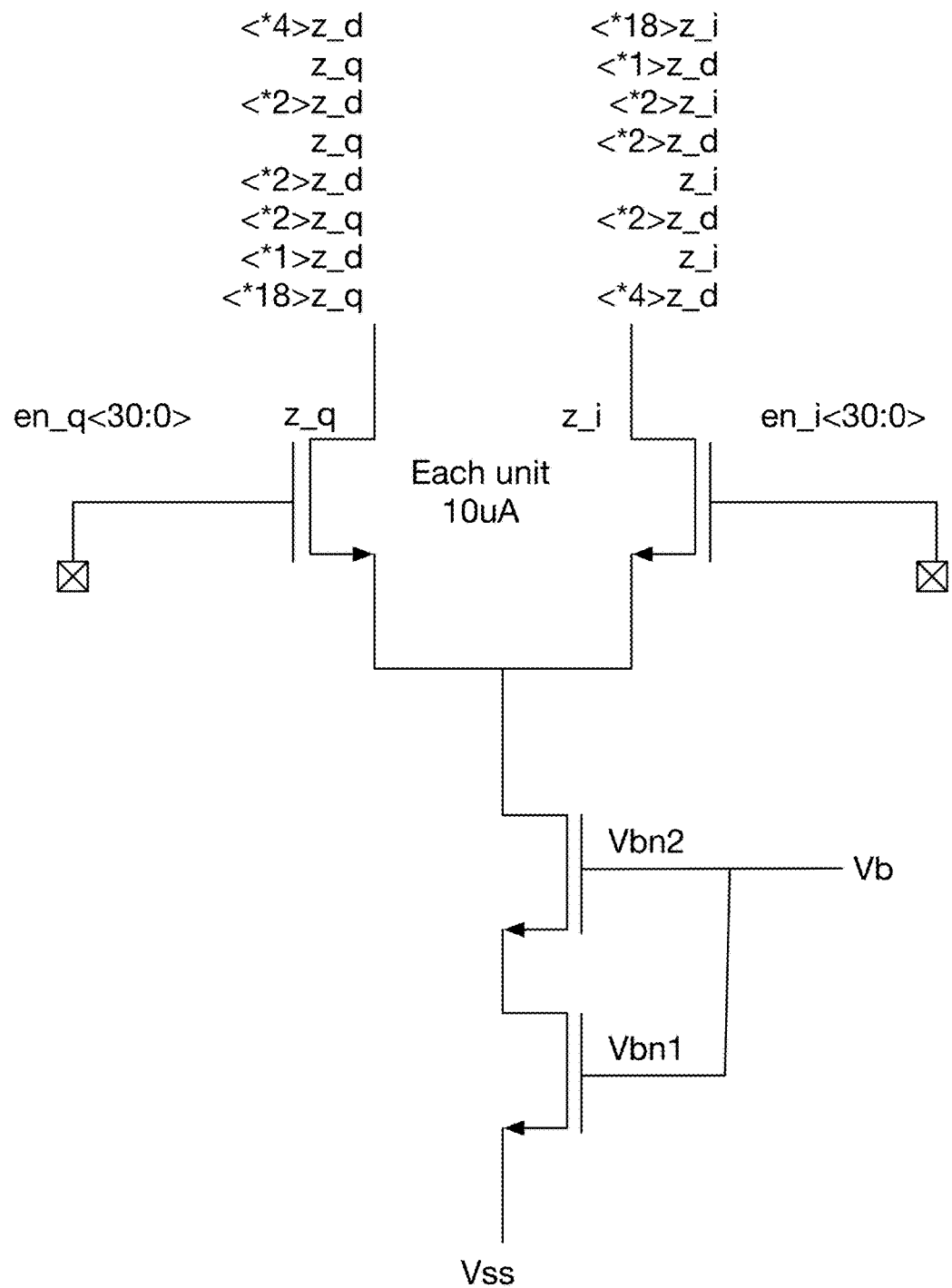
FIG. 15 is a schematic for a digital-to-analog converter (DAC), in accordance with some embodiments.

FIG. 15 is a schematic of a DAC for generating the I and Q control signals, in accordance with some embodiments. As shown, the DAC in FIG. 15 implements the schematics of FIGS. 9 and 10. The DAC shows a differential pair (representing 31 differential pairs), each receiving a corresponding bit of the 31-bit thermometer code (en_q and en_i). Further, FIG. 15 describes the connection of each transistor. For example, looking at the transistor connected to en_q<30:0>, it is seen that the first 18 transistors (denoted <*18>z_q) are connected to the Q common output node, the next transistor (denoted <*1>z_d) is disconnected from the Q common output node, and so on. Same can be said for the transistors connected to en_i<30:0>, in that the first four transistors (<*4>z_d) are disconnected from the I common output node, and the next transistor (<*1>z_i) is connected to the I common output node.

Figure 16A:
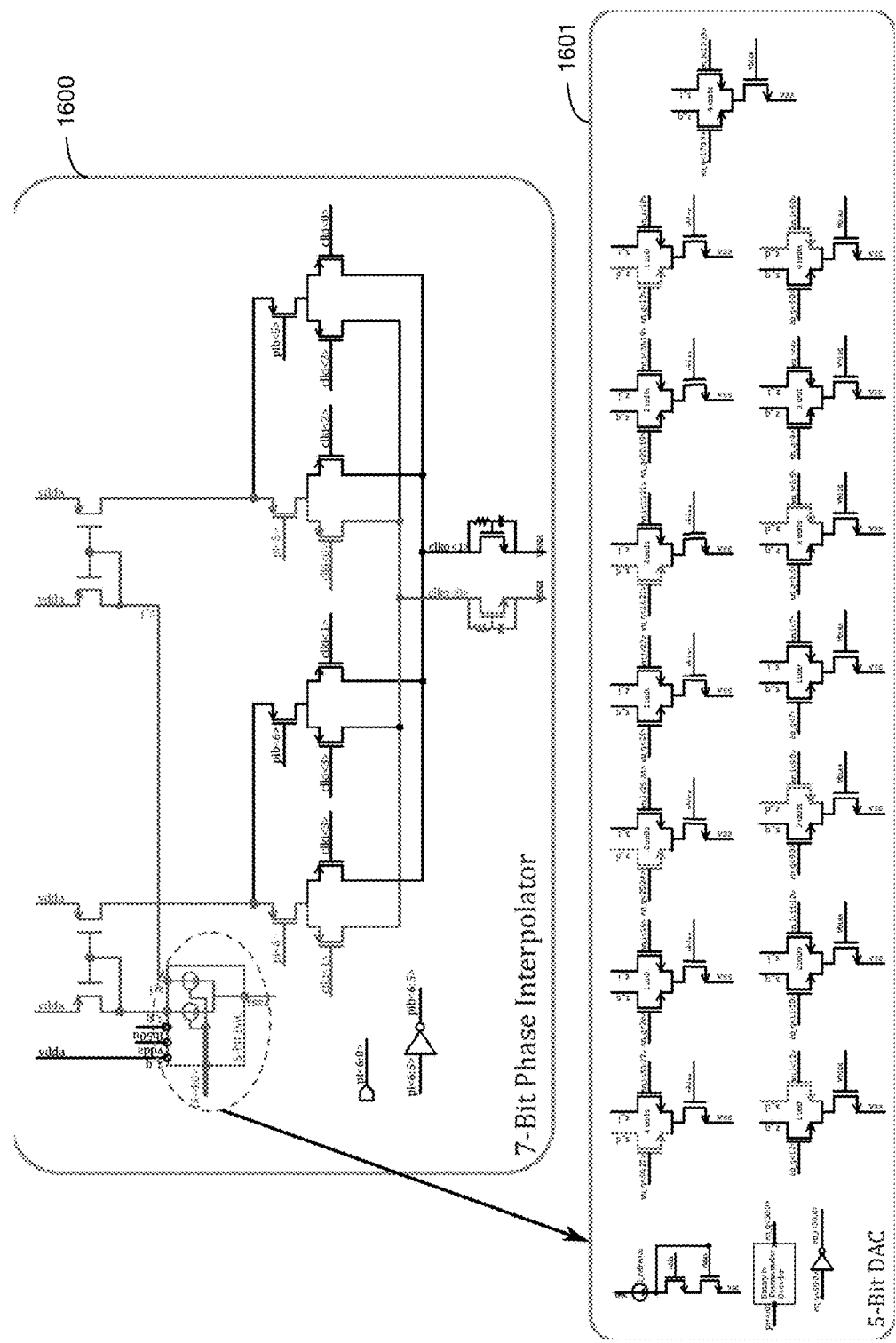
FIGS. 16A-16D are schematics for a phase-interpolator (PI), in accordance with some embodiments.

FIG. 16A illustrates a 7-bit phase interpolator 1600, in accordance with some embodiments. As shown, the phase interpolator includes a 5-bit DAC 1601 generating I and Q control signals using inputs pi<0:4>, as well as a pair of selection bits pi<5:6> for selecting a phase quadrant. The DAC embodiment given in FIGS. 16C and 16D illustrate generation of the I and Q control signals in accordance with the schematics depicted in FIGS. 9 and 10, as well as described by Table II. As shown in FIGS. 16C and 16D, the DAC includes a plurality of differential pairs, each differential pair comprising a first transistor and a second transistor connected to a corresponding current source of a plurality of current sources having equal magnitude. In some embodiments, the magnitude of the current sources is controlled by adjusting a bias current, as shown by adjusting vbias. It should be noted that alternative embodiments may utilize the circuits of FIG. 4. As shown, each differential pair receives a corresponding bit en_q<30:0> of a thermometer codeword at an input of the first transistor and a complement of the corresponding bit en_i<30:0> at an input of the second transistor. The bits of the thermometer code may be generated using binary to thermometer decoder 1612, and the complements en_i<30:0> may be formed by passing thermometer code bits en_q<30:0> through inverter 1618. As shown, the plurality of differential pairs includes a first and a second subset of differential pairs. The first subset of differential pairs has the first transistor connected to a quadrature-phase (Q) common node and the second transistor connected to an in-phase (I) common node. An example differential pair in the first subset is represented by the differential pair 1620 receiving en_q<26> and en_i<26>. The DAC further includes a second subset of differential pairs having either (i) the first transistor connected to the Q common node and the second transistor is disconnected from the I common mode or (ii) the first transistor is disconnected from the Q common node second transistor connected to the I common node. An example differential pair in the second subset is represented by the differential pair 1625 receiving en_q<12> and en_i<12>, where the first transistor is connected to the Q common node and the second transistor is disconnected from the I common node by connecting it to VDD.

Figure 16B:
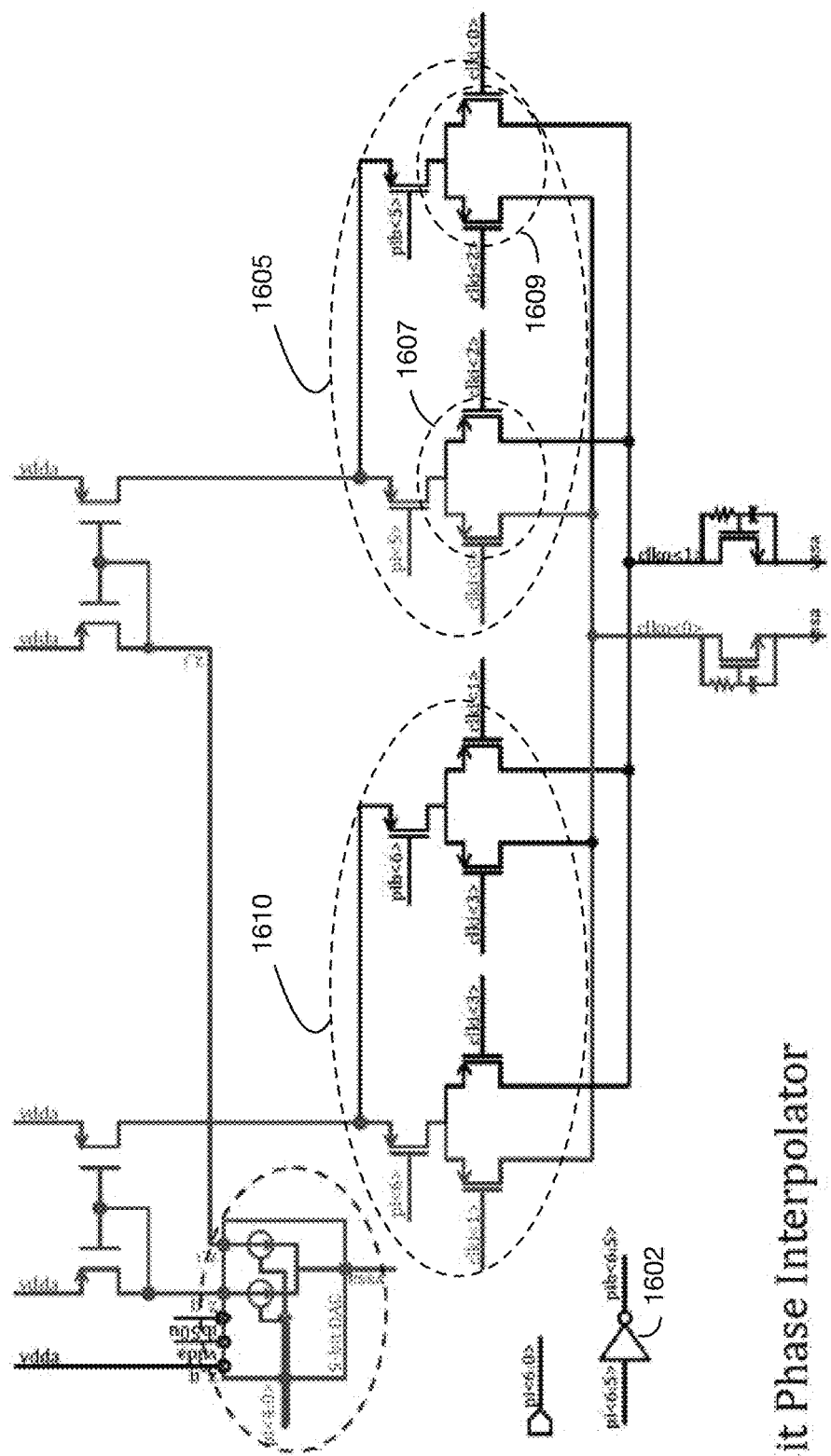
Figure 16C:
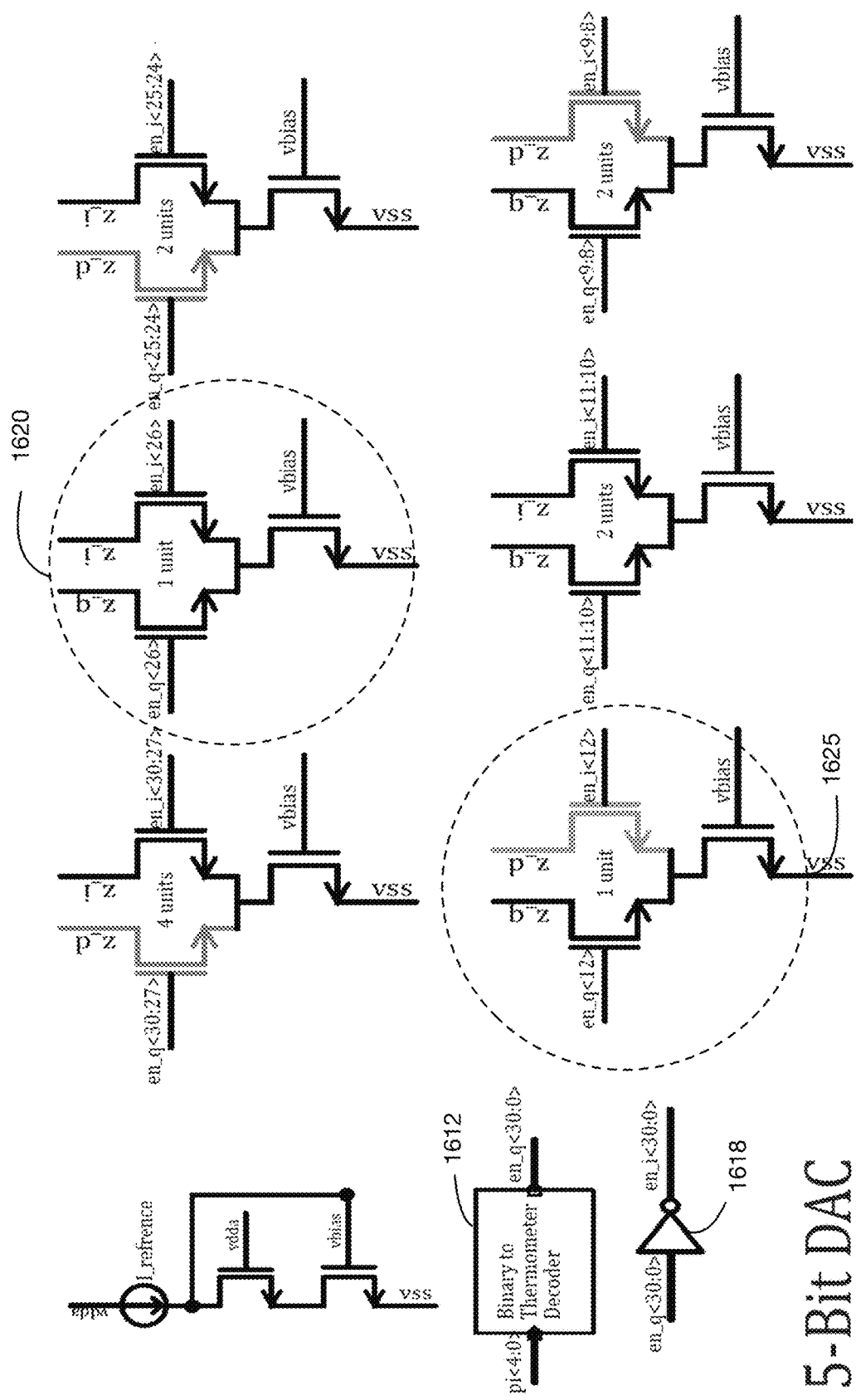
Figure 16D:
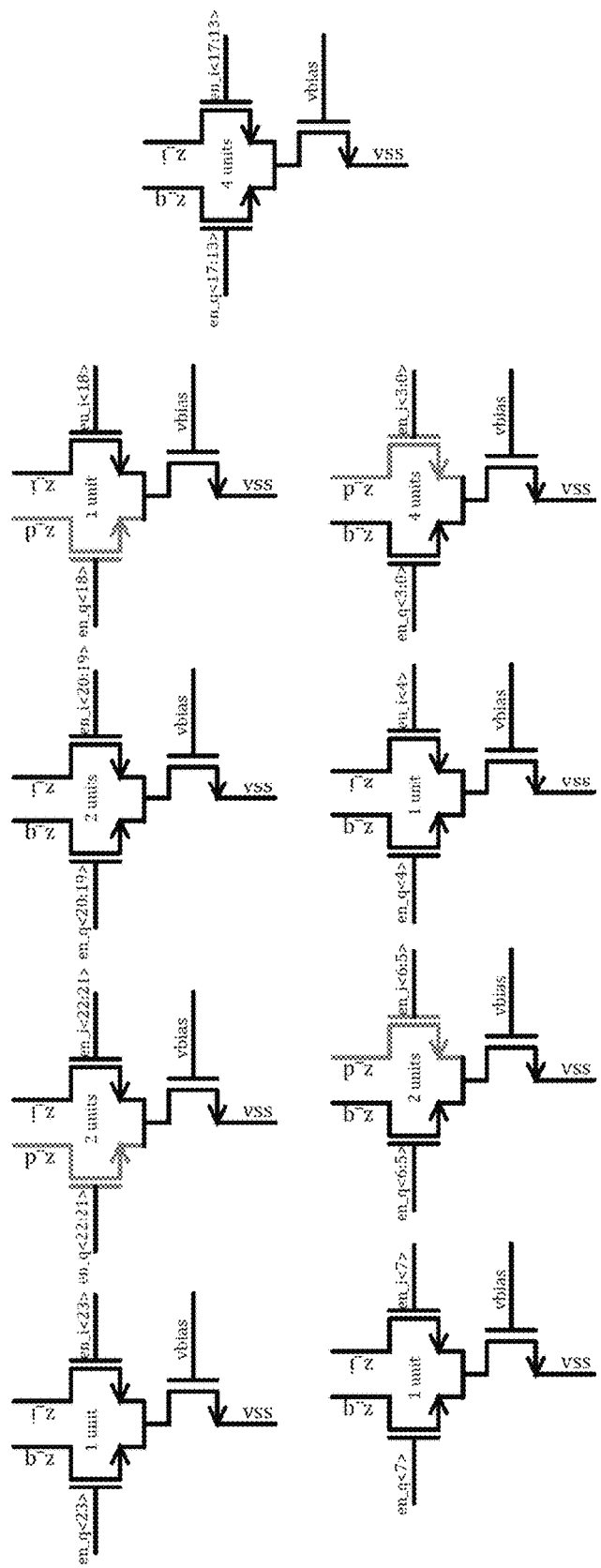

FIG. 16B illustrates phase interpolator 1600 connected to the DAC 1601 described above. As shown, the PI includes a pair of selection circuits 1605 and 1610. The first selection circuit 1605 is connected to a current mirror connected to the I common node and receives a first reference signal (clki<0>/clki<2>), while the second selection circuit 11610 is connected to a current mirror connected to the Q common node and receives a second reference signal (clki<1>/clki<3>). As described above, I and Q control signals are formed from the plurality of differential pairs in the DAC drawing respective currents through the I and Q common nodes (shown as z_i and z_q respectively). Each selection circuit also receives a corresponding selection bit to determine a polarity of the corresponding reference signal. As shown, selection circuit 1605 receives selection bit pi<5> (and its complement pib<5>), while selection circuit 1610 receives selection bit pi<6> (and its complement pib<6>). As shown in FIG. 16B, the complements may be provided by inverter 1602.

As described above, the first selection circuit 1605 receives the first reference signal clki<0>/clki<2>. Clki<0> and clki<2> may be 180 degrees offset clock signals, and the selection circuit is configured to determine which polarity to connect to the output node for the interpolated signal clko<0>/clko<1>. As shown, if pi<5>=1, a first differential pair 1607 is enabled connecting clki<0> to clko<0> and clki<2> to clko<1>. Similarly, if pi<5>=0 (and thus pib<5>=1), a second differential pair 1609 is enabled connecting clki<2> to clko<0> and clki<0> to clko<1>. The second selection circuit 1610 operates in a similar manner in order to connect the second reference signal to the output node for the interpolated signal. Through the use of the selection circuits, pi<5> and pi<6> may select which quadrant of phase to interpolate from. Table III below illustrates this relationship:

TABLE III

| Pi<5> | Pi<6> | Phase Range (Degrees) |
|---|---|---|
| 0 | 0 | 0-90 |
| 1 | 0 | 90-180 |
| 1 | 1 | 180-270 |
| 0 | 1 | 270-360 |

Figure 17:
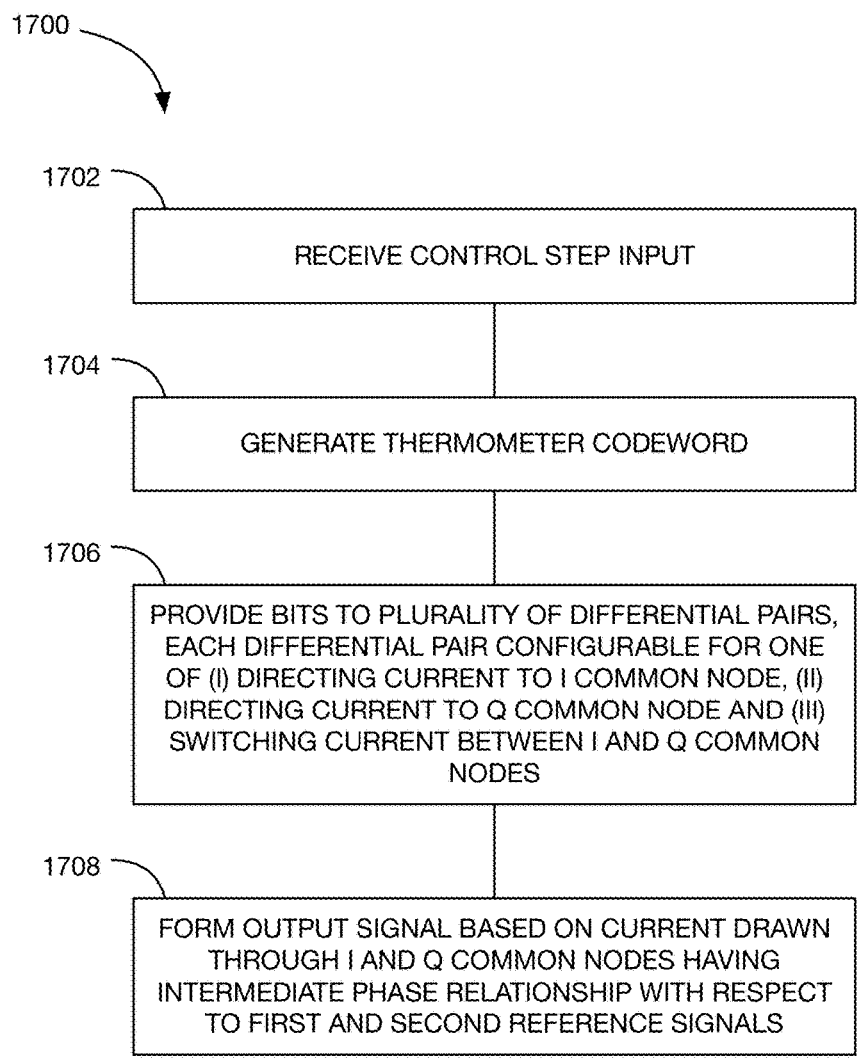
FIG. 17 is a flowchart of a method, in accordance with some embodiments.

FIG. 17 illustrates a flowchart of a method 1700, in accordance with some embodiments. As shown, method 1700 includes receiving, at 1702, a control step input at a binary-to-thermometer decoder and responsively generating, at 1704, bits of a thermometer codeword representative of the control step input. At step 1706, the bits of the thermometer codeword are provided to a plurality of differential pairs comprising a first transistor and a second transistor connected to a corresponding current source of a plurality of current sources having equal magnitude. Each differential pair receives a corresponding bit of the thermometer codeword at an input of the first transistor and a complement of the corresponding bit at an input of the second transistor. Further, each differential pair is configurable for one of (i) directing current to an in-phase (I) common node (ii) directing current to a quadrature phase (Q) common node, and (iii) switching between directing current to the I common node and the Q common node. At 1708, an output signal is formed based on current drawn through the I and Q common nodes, the output signal having an intermediate phase with respect to a first and a second reference signal In some embodiments, the control step input comprises 5 bits the thermometer codeword comprises 31 bits. In some embodiments, the complements of the bits of the thermometer code are generated using an inverter. In some embodiments, a sum of squares of the I and Q control signals is within a threshold of a predetermined constant C. In some embodiments, the first and second reference signals have a phase difference of 90 degrees. In some embodiments, the first and second reference signals are sinusoidal signals. Alternatively, the first and second reference signals may be square wave signals.

In some embodiments, the method further includes determining polarities of the first and second reference signals according to first and second selection bits received at first and second selection circuits, respectively. In some embodiments, determining the polarity of a given reference signal includes enabling one transistor of a pair of transistors associated with the corresponding selection circuit, each transistor of the pair receiving the given reference signal in opposite polarity. In some embodiments, a first transistor of the pair of transistors is enabled according to the selection bit and wherein a second transistor of the pair of transistors is disabled according to a complement of the selection bit.

The invention claimed is:
1. An apparatus comprising:
a control signal generator configured to receive a control step input and to responsively generate a plurality of bits of a thermometer codeword representative of the control step input;
a plurality of equal-sized current sources configured to generate analog in-phase (I) and quadrature phase (Q) control signals as analog summations of currents generated by selectively connecting the equal-sized current sources to corresponding I and Q output nodes, respectively;
a plurality of differential pairs of transistors, each differential pair of transistor connected to a corresponding equal-sized current source of the plurality of equal-sized current sources and configured to selectively connect the corresponding equal-sized current source to one of the I and Q output nodes responsive to a corresponding bit of the plurality of bits of the thermometer codeword, the plurality of differential pairs of transistors comprising (i) a first subset configured to selectively switch the corresponding equal-sized current source between both the I and Q output nodes and (ii) a second subset configured to selectively connect the corresponding equal-sized current source to only one of the I and Q output nodes; and
a phase interpolator configured to receive the analog I and Q control signals and a pair of reference signals, and to responsively generate an interpolated signal having an intermediate phase with respect to pair of reference signals.

2. The apparatus of claim 1, wherein each differential pair of transistors is configured to differentially receive the corresponding bit and a complement of the corresponding bit as inputs.

3. The apparatus of claim 2, further comprising an inverter configured to generate the complement of the corresponding bit of the plurality of bits of the thermometer codeword.

4. The apparatus of claim 1, wherein a sum of squares of magnitudes of the analog I and Q control signals is within a threshold of a predetermined constant C.

5. The apparatus of claim 1, wherein the first and second reference signals have a phase difference of 90 degrees.

6. The apparatus of claim 1, wherein the phase interpolator comprises a selection circuit configured to select the first and second reference signals from a plurality of reference signals.

7. The apparatus of claim 6, wherein the selection circuit is configured to receive two selection bits and to responsively select the first and second reference signals from a set of four reference signals.

8. The apparatus of claim 7, wherein the selection circuit comprises four selection transistor pairs configured to receive corresponding reference signals of the set of four reference signals.

9. The apparatus of claim 8, wherein the four selection transistor pairs are enabled according to the two selection bits.

10. The apparatus of claim 9, wherein first and second selection transistor pairs of the four selection transistor pairs are enabled by corresponding bits of the two selection bits, and wherein third and fourth selection transistor pairs are enabled by corresponding complemented versions of the two selection bits.

11. A method comprising:

generating a plurality of bits of a thermometer codeword representative of a received control step input;

providing each bit of the plurality of bits of the thermometer code to a corresponding differential pair of transistors of a plurality of differential pairs of transistors, each differential pair of transistor selective connecting a corresponding equal-sized current source of a plurality of equal-sized current sources to one of an in-phase (I) and a quadrature phase (Q) output node, the plurality of differential pairs of transistors comprising (i) a first subset configured to selectively switch the corresponding equal-sized current source between both the I and Q output nodes and (ii) a second subset configured to selectively connect the corresponding equal-sized current source to only one of the I and Q output nodes;

generating analog I and Q control signals as analog summations of current generated by the plurality of equal-sized current sources in response to being selectively connected to the I and Q output nodes, respectively; and providing the I and Q control signals to a phase interpolator, the phase interpolator further receiving first and second reference signals and responsively generating an interpolated signal having an intermediate phase with respect to the first and second reference signals.

12. The method of claim 11, wherein a complement of each bit of the plurality of bits of the thermometer codeword is further provided to the corresponding differential pair of transistors.

13. The method of claim 12, wherein the complement of each bit is generated using a logic inverter.

14. The method of claim 11, wherein a sum of squares of magnitudes of the analog I and Q control signals is within a threshold of a predetermined constant C.

15. The method of claim 11, wherein the first and second reference signals have a phase difference of 90 degrees.

16. The method of claim 11, further comprising providing the first and second reference signals to the phase interpolator using a selection circuit.

17. The method of claim 16, wherein the first and second reference signals are selected from a set of four reference signals using the selection circuit.

18. The method of claim 17, wherein providing the first and second reference signals comprises providing two selection bits to four selection transistor pairs in the selection circuit, each selection transistor pair receiving a corresponding reference signal of the set of four reference signals.

19. The method of claim 18, wherein providing the first and second reference signals further comprises enabling two selection transistor pairs according to the two selection bits.

20. The method of claim 19, wherein first and second selection transistor pairs of the four transistor pairs are enabled by corresponding bits of the two selection bits, and wherein third and fourth selection transistor pairs are enabled by corresponding complemented versions of the two selection bits.

* * * * *